United States Patent
Bingel et al.

(10) Patent No.: US 7,428,465 B2
(45) Date of Patent: Sep. 23, 2008

(54) TESTING CONTROL METHODS FOR USE IN CURRENT MANAGEMENT SYSTEMS FOR DIGITAL LOGIC DEVICES

(75) Inventors: Thomas J. Bingel, Indian Rocks Beach, FL (US); Deanne Tran, Palm Harbor, FL (US)

(73) Assignee: Honeywell International Inc., Morristown, NJ (US)

( * ) Notice: Subject to any disclaimer, the term of this patent is extended or adjusted under 35 U.S.C. 154(b) by 421 days.

(21) Appl. No.: 11/340,287

(22) Filed: Jan. 26, 2006

(65) Prior Publication Data

US 2007/0171106 A1    Jul. 26, 2007

(51) Int. Cl.
*G01R 35/00* (2006.01)

(52) U.S. Cl. ............ 702/107; 702/85; 326/21; 326/31; 327/538

(58) Field of Classification Search ........ 326/21, 326/26–27, 31, 33–34; 327/538–545; 702/85–107
See application file for complete search history.

(56) References Cited

U.S. PATENT DOCUMENTS

| 6,040,707 A | * | 3/2000 | Young et al. ............ 326/21 |
| 6,967,853 B2 | * | 11/2005 | DeFazio et al. ........ 363/49 |
| 7,076,384 B1 | * | 7/2006 | Radulov et al. ........ 702/85 |

* cited by examiner

*Primary Examiner*—Rexford Barnie
*Assistant Examiner*—Jason M Crawford
(74) *Attorney, Agent, or Firm*—Fogg & Powers LLC

(57) ABSTRACT

Systems and methods for Current Management of Digital Logic Devices are provided. In one embodiment a method for calibrating a digital logic circuit current management system is provided. The method comprises activating one or more synchronous logic paths of a plurality of synchronous logic paths within the digital logic integrated circuit; sampling a voltage powering the digital logic integrated circuit while activating the one or more synchronous logic paths; storing one or more data samples representative of the sampled voltage; and calculating a bypass current setpoint based on the one or more data samples, wherein the bypass current setpoint specifies one or more bypass current characteristic to prevent the voltage powering the digital logic integrated circuit from dropping below a reference voltage.

27 Claims, 7 Drawing Sheets

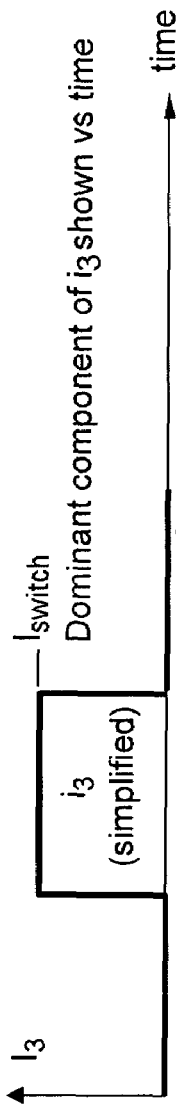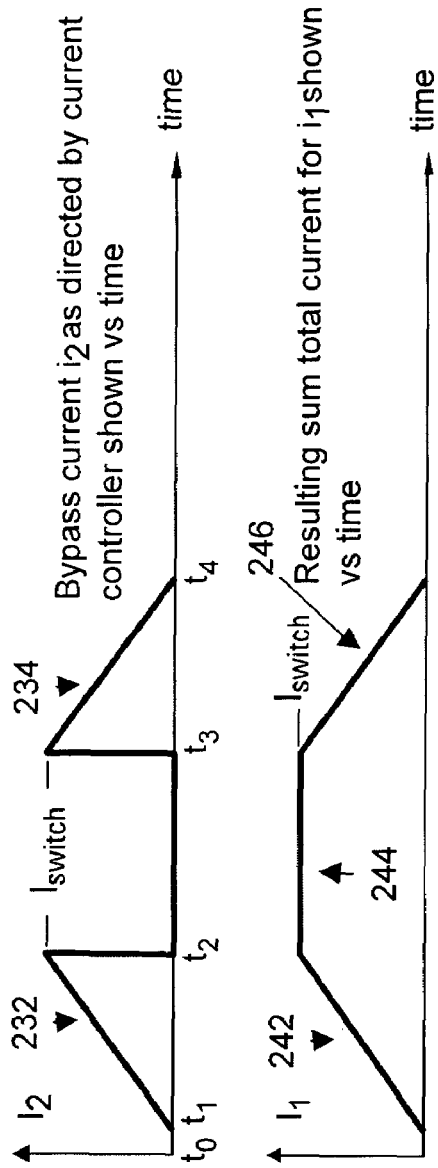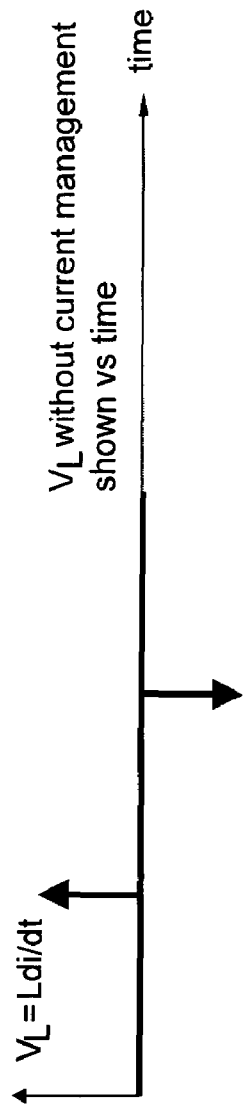
Fig. 2A 220
Fig. 2B 230
Fig. 2C 240
Fig. 2D 250
Fig. 2E 260

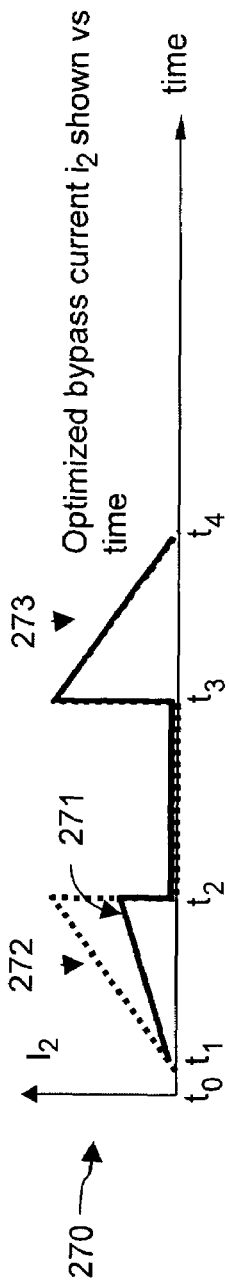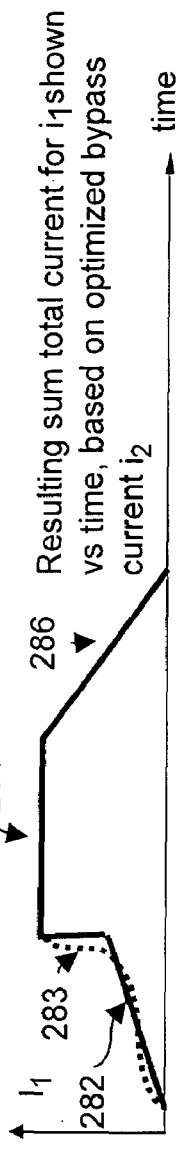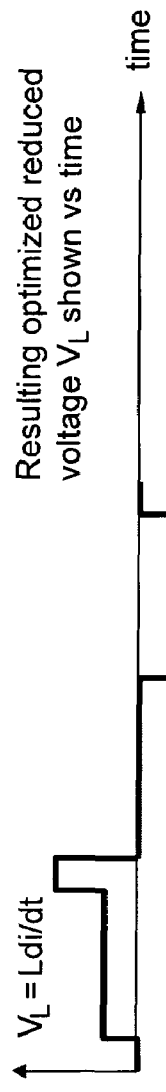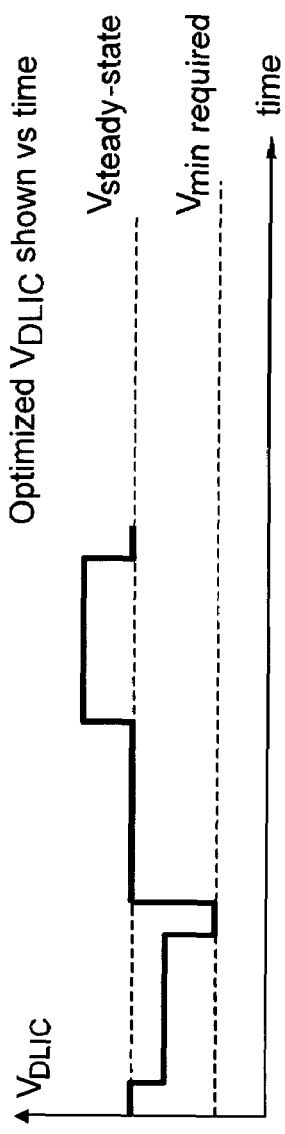
Fig. 2F 270
Fig. 2G 280
Fig. 2H 290
Fig. 2I 295

TESTING CONTROL METHODS FOR USE IN CURRENT MANAGEMENT SYSTEMS FOR DIGITAL LOGIC DEVICES

CROSS REFERENCES

This application is also related to the following co-pending United States patent application filed on even data herewith, which is hereby incorporated herein by reference:

U.S. patent application Ser. No. 11,340,245 entitled "Systems and Methods for Current Management for Digital Logic Devices") and which is referred to here as the '949 Application; and U.S. patent application Ser. No. 11,340,285 entitled "Systems and Methods for Current Management for Digital Logic Devices") and which is referred to here as the '085 Application.

TECHNICAL FIELD

The present invention generally relates to digital logic circuits and more specifically to current management for digital logic devices.

BACKGROUND

In the current state of the art, digital logic power-supply decoupling is achieved using decoupling capacitors. A digital logic device, due to its discrete nature, switches logic states between on and off. This digital switching causes transient currents to be generated, which must be supplied by the power distribution system. Typically, decoupling capacitors in proximity to the digital logic are used to supply the transient current. However, parasitic inductances are always present between the digital logic and the decoupling capacitor. These inductances react to changes in digital logic device current demand by producing voltages that impede the ability of decoupling capacitors to supply transient current to the digital logic. In simulations, it is apparent that this parasitic inductance is the prime limitation to the success of the decoupling capacitor in achieving its function—that of ensuring the power-supply voltage at the digital logic remains fixed at all times. Little has changed in the past 40 years, except incremental means of reducing the parasitic inductance between digital-logic integrated circuits and decoupling capacitors.

For the reasons stated above and for other reasons stated below which will become apparent to those skilled in the art upon reading and understanding the specification, there is a need in the art for improved systems and methods for current management for digital logic devices.

SUMMARY

The Embodiments of the present invention provide methods and systems for digital logic circuit current management and will be understood by reading and studying the following specification.

In one embodiment, a method for calibrating a digital logic circuit current management system is provided. The method comprises activating one or more synchronous logic paths of a plurality of synchronous logic paths within the digital logic integrated circuit; sampling a voltage powering the digital logic integrated circuit while activating the one or more synchronous logic paths; storing one or more data samples representative of the sampled voltage; and calculating a bypass current setpoint based on the one or more data samples, wherein the bypass current setpoint specifies one or more bypass current characteristic to prevent the voltage powering the digital logic integrated circuit from dropping below a reference voltage.

In another embodiment, a current management system for a digital logic integrated circuit is provided. The system comprises means for controlling a bypass current, the means for controlling adapted to control the bypass current based on a priori information about an impending current need of a digital logic integrated circuit; means for drawing the bypass current from the means for supplying current, the means for drawing the bypass current connected electrically in parallel with a digital logic integrated circuit and responsive to the means for controlling; means for activating one or more synchronous logic paths of a plurality of synchronous logic paths within the digital logic integrated circuit; means for sampling a voltage powering the digital logic integrated circuit while activating the one or more synchronous logic paths, the means for sampling responsive to the means for activating; means for storing one or more data samples representative of the sampled voltage, the means for storing responsive to the means for sampling; and means for calculating one or more bypass current setpoints based on the one or more data samples, wherein the one or more bypass current setpoints specify one or more bypass current characteristic.

In yet another embodiment, a computer-readable medium having computer-executable instructions for calibrating a digital logic circuit current management system is provided. The method comprises activating one or more synchronous logic paths of a plurality of synchronous logic paths within the digital logic integrated circuit; sampling a voltage powering the digital logic integrated circuit while activating the one or more synchronous logic paths; storing one or more data samples representative of the sampled voltage; and calculating one or more bypass current setpoints based on the one or more data samples, wherein the one or more bypass current setpoints are calculated to limit a peak current of a bypass current to prevent a voltage powering a digital logic integrated circuit from dropping below a reference voltage.

DRAWINGS

Embodiments of the present invention can be more easily understood and further advantages and uses thereof more readily apparent, when considered in view of the description of the preferred embodiments and the following figures in which:

FIGS. 1A and 1B are diagrams illustrating a current management system of one embodiment of the present invention;

FIGS. 2A-2E provide a series of charts illustrating current magnitudes and voltages within a current management system of one embodiment of the present invention;

FIGS. 2F-2I provide a series of charts illustrating optimized current magnitudes and voltages within a current management system of one embodiment of the present invention;

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide methods and systems for current management for digital logic devices. Embodiments of the present invention comprise systems and methods of reducing current demand variations on digital logic power supplies caused by digital logic switching, and thereby reduce impediments caused by parasitic inductance. Because the voltage developed across a parasitic inductance is equal to L times the change in current with respect to time, and the parasitic inductance is generally small, but never zero, embodiments of the present invention use: 1) a priori information about the impending current needs, and 2) current management circuitry to control current in a path in parallel with the digital logic circuitry. The a priori information is used to ramp up or down the power supply current in advance of a digital-logic switching event to reduce di/dt, and thus reduce the transient parasitic voltage drop in the power supply system that would result during normal operation.

Figure 1A:
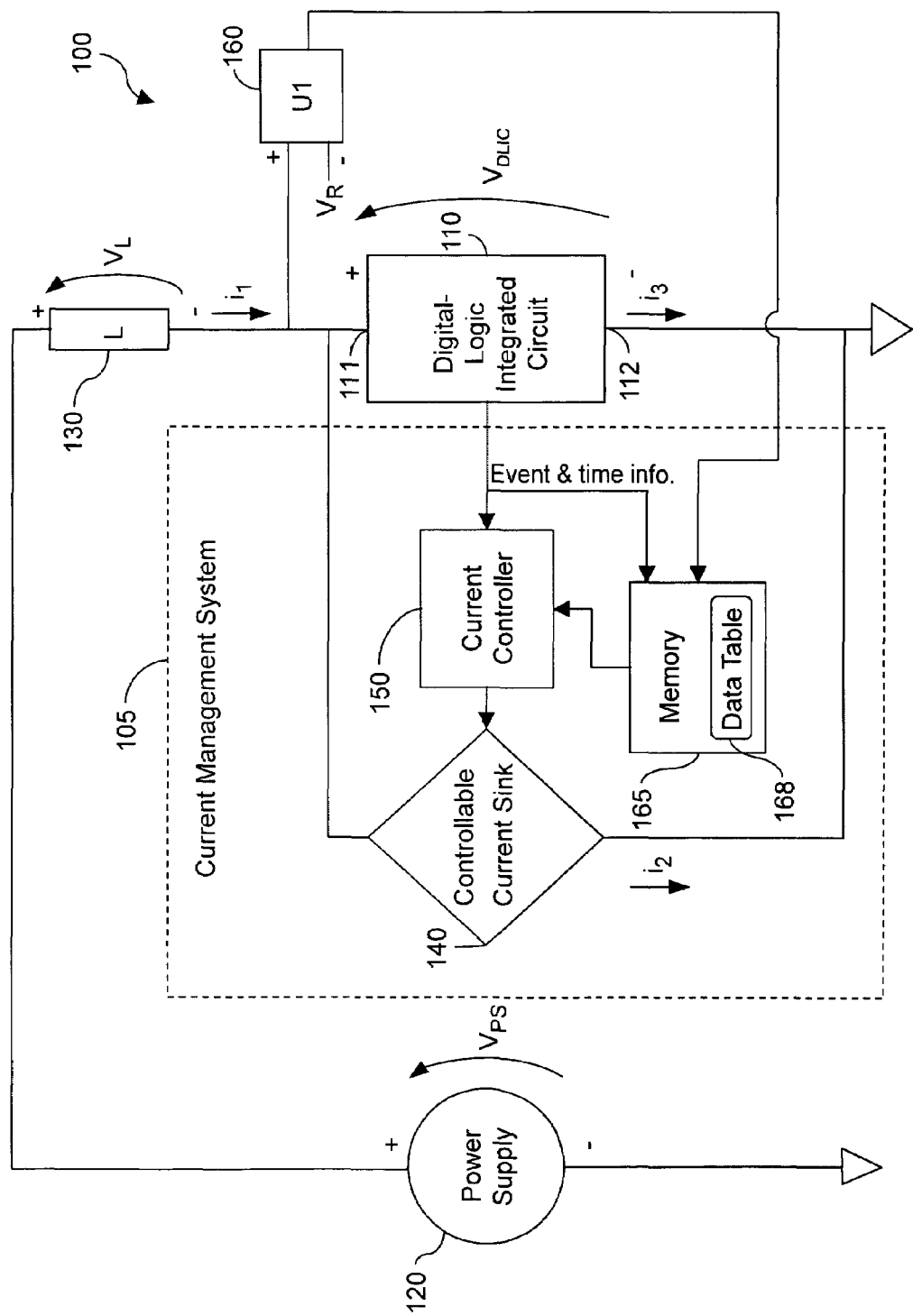

FIG. 1 is a block diagram illustrating a system 100 for managing current, of one embodiment of the present invention. System 100 comprises a digital logic integrated circuit 110 coupled to receive power ($V_{ps}$) from a digital logic power supply 120. In one embodiment, digital logic integrated circuit 110 is a small-scale integrated circuit (SSI) comprising gates that perform simple functions such as, but not limited to, AND, NAND, OR, NOR and INVERTER. In alternate embodiments, digital logic integrated circuit 110 comprises a high performance processor, such as, but not limited to, a microprocessor, and a digital signal processor. System 100 further comprises a current management system 105. In one embodiment, current management system 105 includes a controllable current sink 140 and a current controller 150. Controllable current sink 140 is coupled in parallel with power connections 111 and 112 of digital logic integrated circuit 110 as shown. Controllable current sink 140 is further coupled to receive a control signal from a current controller 150, which in one embodiment is coupled to digital logic integrated circuit 110.

In operation, when digital logic integrated circuit 110 performs a logic switching operation, the change in current demand ($i_3$) of digital logic integrated circuit 110 is approximated by a step response, as illustrated generally by FIG. 2A at 220. In the absence of current management system 105, parasitic inductances 130 between digital logic integrated circuit 110 and power supply 120 respond to such an abrupt change in current by generating a voltage response ($V_L = L di_1/dt$) as illustrated by FIG. 2E at 260. The generation of $V_L$ in between power supply 120 and digital logic integrated circuit 110 causes fluctuations in the voltage ($V_{DLIC}$) available to power digital logic integrated circuit 110.

Current management system 105 mitigates and limits the voltage $V_L$ generated by parasitic inductances 130. In one embodiment, as described in detail by the '949 Application herein incorporated by reference, prior to the digital logic integrated circuit 110 switching operation, controllable current sink 140 of current management system 105 ramps a bypass current ($i_2$) up to an expected switching value $I_{switch}$ (shown in FIG. 2B at 232). Then, after the digital logic integrated circuit 110 switching operation, controllable current sink 140 ramps bypass current $i_2$ from $I_{switch}$ back to a steady state level (shown in FIG. 2B at 234). The resulting current ($i_1 = i_2 + i_3$) from power supply 120, shown generally in FIG. 2C at 240, comprises a first ramp 242, a plateau 244 and a second ramp 246. As would be appreciated by one skilled in the art upon reading this specification, the absence of abrupt current discontinuities in $i_1$ results in the generation of a transient parasitic voltage $V_L$ (shown in FIG. 2D at 250) that is significantly reduced compared to the spiking transient parasitic voltage $V_L$ (shown in FIG. 2E at 260) that would be produced by $i_3$ alone. Thus, the voltage ($V_{DLIC}$) available to power digital logic integrated circuit 110 is consistently maintained within specification limits throughout the switching operation.

In one embodiment, controllable current sink 140 determines when to ramp up and ramp down bypass current $i_2$ via a control signal provided by current controller 150. Current controller 150 outputs a control signal that is based on a priori information about the impending current needs of digital logic integrated circuit 110. The a priori information can be obtained in a number of ways as described in the '949 and the '085 applications herein incorporated by reference.

In one embodiment of the present invention, in order to determine a maximum current for bypass current $i_2$, system 100 observes the voltage drop in $V_{DLIC}$ that occurs during switching operations by digital logic integrated circuit 110. In one embodiment, system 100 further comprises a voltage monitor (U1) 160. In one embodiment, voltage monitor 160 comprises a comparator device having a non-inverting input connected to power terminal 111 of digital logic integrated circuit 110, and an inverting input connected to a reference voltage $V_R$. In one embodiment, the value of $V_R$ is based on a minimum voltage rating ($V_{min\ required}$) for digital logic integrated circuit 110, below which operation of digital logic integrated circuit 110 is not guaranteed. For many applications, a typical value for $V_R$ is 4.5 VDC. In an alternate embodiment, voltage monitor (U1) 160 comprises an analog to digital converter that converts a voltage measured at power terminal 111 to a digital signal. Note that, when using a comparator device for voltage monitor 160, $V_R$ need not be fixed, but in an alternate embodiment, $V_R$ is set to differing voltages to provide more detailed information. Similarly, in one embodiment, when voltage monitor 160 comprises an analog to digital converter, a high-speed analog-to-digital converter is utilized in lieu of a comparator circuit. In both cases, the detailed information captured and stored as discussed below is utilized to reduce the change in $V_{DLIC}$ during digital logic integrated circuit 110 operation.

In one embodiment, an optimum operation of current management system 105 is obtained by ramping $i_2$ to a current level that allows $V_{DLIC}$ to drop to exactly $V_{min\ required}$ (i.e., digital logic integrated circuit 110's minimum required operating voltage). As used in this specification, the terms "optimum" and "optimized" directly refer to $V_{DLIC}$ dropping to within an acceptable variance, v, of $V_{min\ required}$, as discussed in greater detail below. This optimized approach (illustrated by FIGS. 2G to 2J) consumes less power (i.e., the integral of $I_2 * V_{DLIC}$ over time) than when controlling bypass current $i_2$ based strictly on reducing transient parasitic voltage $V_L$. In one embodiment, when current controller 150 ramps bypass current $i_2$ in response to a priori information of a logic switching operation by digital logic integrated circuit 110, bypass current $i_2$ is limited to maintain $V_{DLIC}$ at or above $V_{min\ required}$.

In one embodiment, to reduce power consumption, the present invention adjusts one of the peak value of bypass current $i_2$, the ramp rate of bypass current $i_2$, and a transition time (e.g., starting at time $t_1$ and finishing at time $t_2$ as shown by example in FIG. 2F) for ramping bypass current $i_2$, while allowing $V_{DLIC}$ to drop all the way to $V_{min\ required}$.

FIG. 2F (generally at 270) illustrates an optimized bypass current $i_2$ (shown at 271) controlled by current controller 150 to have a reduced peak current and slope when compared to a non-optimized bypass current $i_2$ (illustrated at 272). The resulting current ($i_1=i_2+i_3$) from power supply 120 shown generally in FIG. 2G at 280, comprises a first ramp 282, a plateau 284 and a second ramp 286. The transient parasitic voltage $V_L$ resulting from power supply 120 current transients is illustrated generally by FIG. 2H at 290 and the corresponding optimized transient response of $V_{DLIC}$ by FIG. 2I at 295. Reducing the peak voltage of bypass current $i_2$ and allowing $V_{DLIC}$ to drop to exactly $V_{min\ required}$ by controlling bypass current $i_2$, as digital logic integrated circuit 110 initiates a logic switching operation, thus reduces the total power that must be supplied by power supply 120 compared to non-optimized current management approaches. Note that for clarity of explanation in FIGS. 2A to 2I, all increasing and decreasing current ramps for bypass current $i_2$ are shown linearly increasing or linearly decreasing, with abrupt turn-on and turn-off at the beginning and end of the current ramps. (A non-linear representation of one potential resulting current $i_1$, is shown generally at 283). Also, shown for clarity, $i_3$ is shown as a simplified pulse in FIG. 2A. However, one skilled in the art upon reading this specification would appreciate that $i_3$ will typically not be an ideal current pulse, and bypass current $i_2$ will typically be realized by gradual and generally non-linear increasing and decreasing current ramps, such that the sum of $i_2+i_3$ yields a low $di_1/dt$. Gradual and generally non-linear adjustments of bypass current $i_2$ reduce voltage change in $V_{DLIC}$ during digital logic operation.

The intended sequence of operation of system 100 includes two phases: a test phase, and a normal operation phase. Operation of system 100 during the normal operation phase is described in detail by the '085 Application herein incorporated by reference.

Figure 1B:
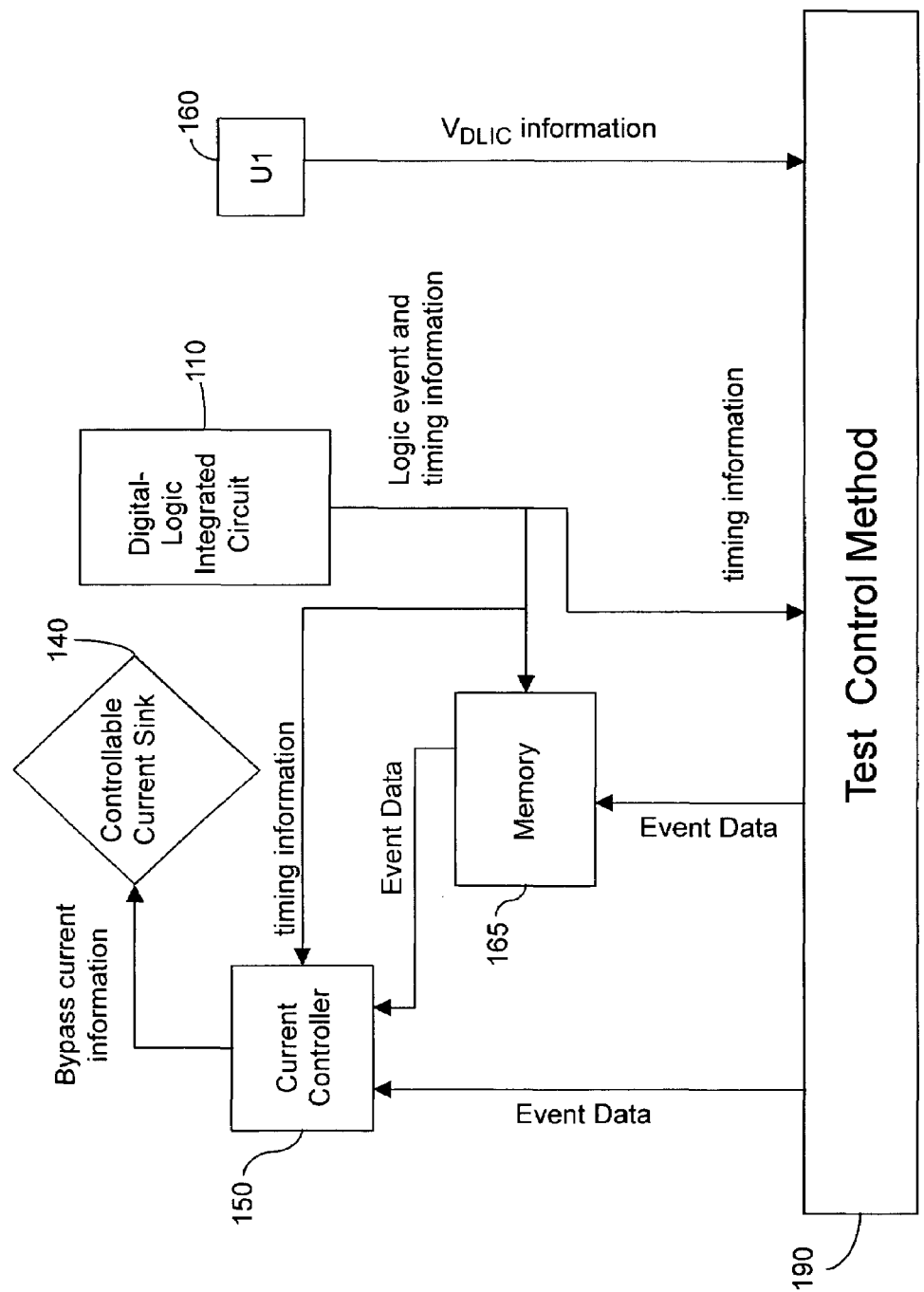

FIG. 1B provides a block diagram illustrating the flow of information within system 100 of one embodiment of the present invention. A test control method 190 (such as those describe in greater detail in FIGS. 3, 4 and 5 below) collects $V_{DLIC}$ information from voltage monitor 160. In one embodiment, the $V_{DLIC}$ information includes samples of the voltage, $V_{DLIC}$ powering digital logic integrated circuit 110. In one embodiment, the $V_{DLIC}$ information represents the difference between $V_{DLIC}$ and reference voltage $V_R$. Test control method 190 further collects event timing information from digital logic integrated circuit 110. The timing information provides information as to when a logic event is executed by digital logic integrated circuit 110. By pairing timing information received from digital logic integrated circuit 110 and $V_{DLIC}$ information from voltage monitor 160, test control method 190 can correlate the $V_{DLIC}$ information associated with logic events. Test control method 190 provides event data obtained to one or both of current controller 150 and memory 165 to enable current controller 150 to control controllable current sink 140 and establish the desired bypass current $i_2$ characteristics during the test phase discussed below. As described below, event data includes information such as the identity of logic events, $V_{DLIC}$ information associated with logic events, and bypass current $i_2$ characteristics associated with logic events. Then in one embodiment during the normal operation phase, when test control method 190 is no longer present, digital logic integrated circuit 110 provides one or both of logic event and timing information to enable current controller 150 to control controllable current sink 140 and establish the desired bypass current $i_2$ characteristics by accessing the event data stored in memory 165 during the test phase.

Embodiments of the present invention provide systems and methods to execute a test routine to generate, capture, and store test data during the first, or "test" phase described in detail by the '085 application herein incorporated by reference. In one embodiment, this test data is stored to correlate an event identifier, ramp duration time (e.g. $t_1$, $t_2$), and peak bypass current $i_2$. In one embodiment, feedback from voltage monitor 160 is applied to reduce power consumption by minimizing $i_2$ peak current and/or $i_2$ transition time by allowing $V_{DLIC}$ to drop, within practical limits, to $V_{min\ required}$, the DLIC's minimum guaranteed operating voltage. During the second, or "normal operation" phase, data obtained from the test phase and stored in data table 168 is used for input to the current controller 150, which in turn, controls controllable current sink 140 producing the appropriate bypass current $i_2$ immediately preceding and following the execution of a digital logic operation event.

Figure 3:
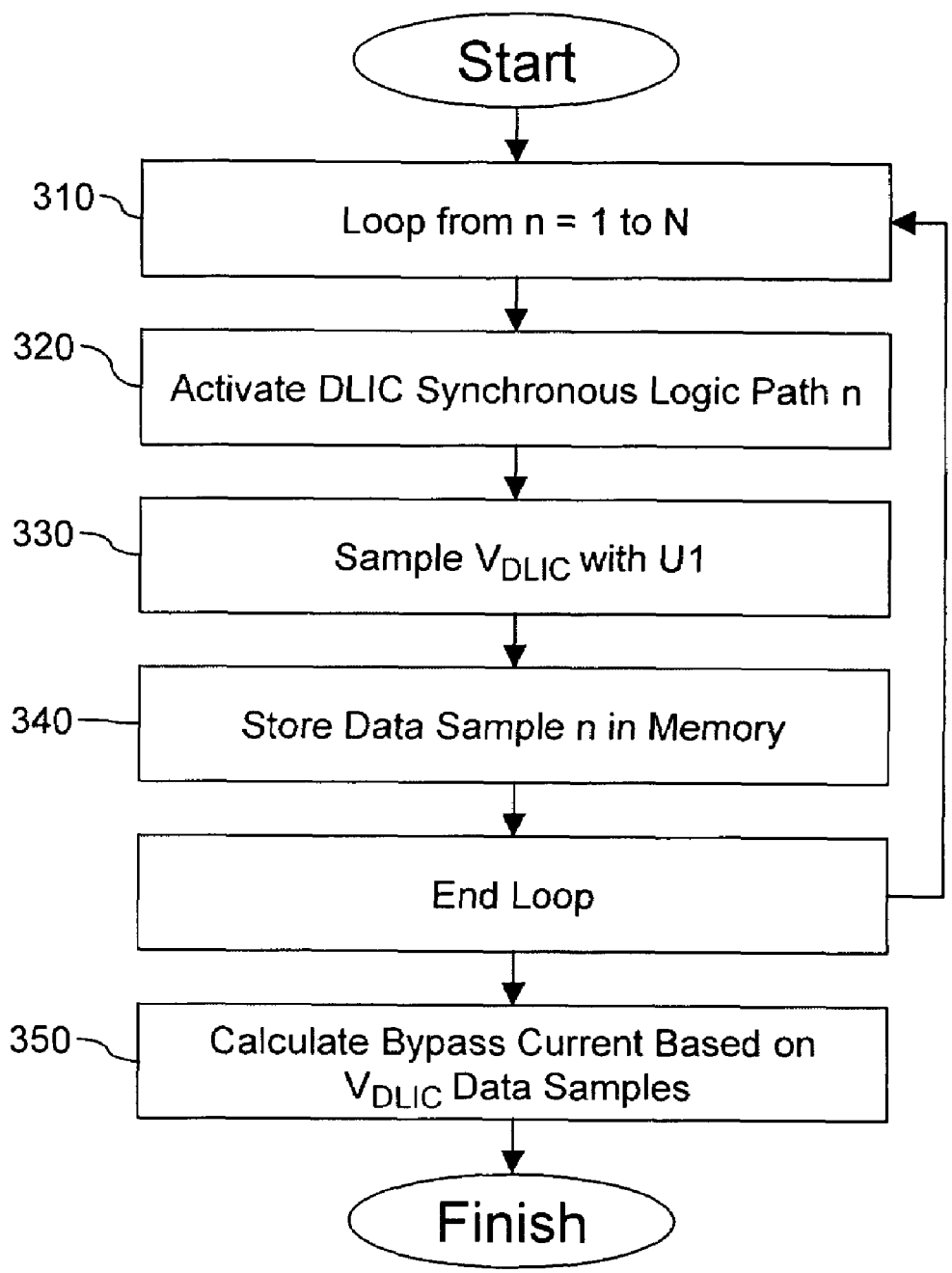
FIG. 3 is a flow chart illustrating a method of one embodiment of the present invention.

FIG. 3 is a flow chart illustrating a method of one embodiment of the present invention for determining one or more bypass current $i_2$ characteristics which ensure that current management system 105 maintains $V_{DLIC}$ at or above $V_R$ while reducing transient parasitic voltages $V_L$ as discussed above and in the '949 and '085 Applications herein incorporated by reference. The method coordinates calibration of current management system 105 and generates test data for use by current management system 105 in determining a bypass current setpoint. In one embodiment, a bypass current setpoint specifies one or more characteristics of bypass current $i_2$ including one or more of the peak current for bypass current $i_2$ and the transition time for bringing bypass current $i_2$ to the peak current level. The method comprises a loop sequence beginning at 310 which cycles in one step increments from one to N, where N is defined as the total number of synchronous logic paths that will be executed in the test mode. Certain micro-code instructions, such as but not limited to 64-bit floating point multiply and 64-bit floating-point divide, are known by those skilled in the art to toggle a large number of gates along a synchronous logic path within digital logic integrated circuit 110, causing large transients in the current demand $i_3$ of digital logic integrated circuit 110. The method provides for digital logic integrated circuit 110 to execute a one or more of such micro-code instructions, while observing $V_{DLIC}$, and collects test data that enables current management system 105 to determine a bypass current setpoint.

The method proceeds to 320 with activating an n'th synchronous logic path within digital logic integrated circuit 110, where n is equal to the current loop cycle. For example, during a first loop cycle, the method activates a first synchronous logic path. In one embodiment, activating the n'th synchronous logic path further comprises executing one or more micro-code instructions within digital logic integrated circuit 110. The method then continues to 330 with sampling $V_{DLIC}$. In one embodiment, sampling $V_{DLIC}$ comprises capturing $V_{DLIC}$ with a digital to analog converter that outputs a digital signal representative of $V_{DLIC}$. In one embodiment, sampling $V_{DLIC}$ comprises comparing $V_{DLIC}$ against reference voltage $V_R$. In one embodiment, $V_R$ is equal to $V_{min\ required}$. The method proceeds to 340 and stores the captured test data in memory. In one embodiment, storing captured data comprises one or both of storing data representing $V_{DLIC}$ and storing data representing the difference between $V_{DLIC}$ and $V_R$. In one embodiment, current management system 105 only stores data samples that correlate in time with the execution of a synchronous logic path by digital logic integrated circuit 110. In one embodiment, current management system 105 correlates captured $V_{DLIC}$ data with the execution of a synchronous logic path based on a priori information supplied by digital logic integrated circuit 110 as discussed in the '949 and '085 Applications herein incorporated by reference. The method then returns to 310, sampling $V_{DLIC}$ for each of the N synchronous logic paths and storing the test data into memory. In one embodiment, when the loop is complete, the method continues to 350 and calculates one or more bypass current characteristics that will maintain $V_{DLIC}$ at or above $V_R$ for any of the N synchronous logic paths executed by digital logic integrated circuit 110 during the calibration. In one embodiment, calculates one or more bypass current characteristics includes calculating one or both of a peak bypass current, or a bypass current duration, based on the sampled $V_{DLIC}$ measurements using standard calculations known to those of ordinary skill in the art. In one embodiment, the bypass current characteristics are stored in memory as a bypass current setpoint.

In one embodiment, the method of FIG. 3 is performed during one or more of the initialization of digital logic integrated circuit 110, power-up of digital logic integrated circuit 110, and during a diagnostic test routine. In one embodiment, after calibration via the method of FIG. 3 is complete, current management system 105 shifts from the test phase to the normal operation phase. In the normal operation phase, current controller 150 ramps bypass current $i_2$ in response to a prior information about the impending current needs of digital logic integrated circuit 110, as described above and in the '949 and '085 Applications herein incorporated by reference.

Figure 4:
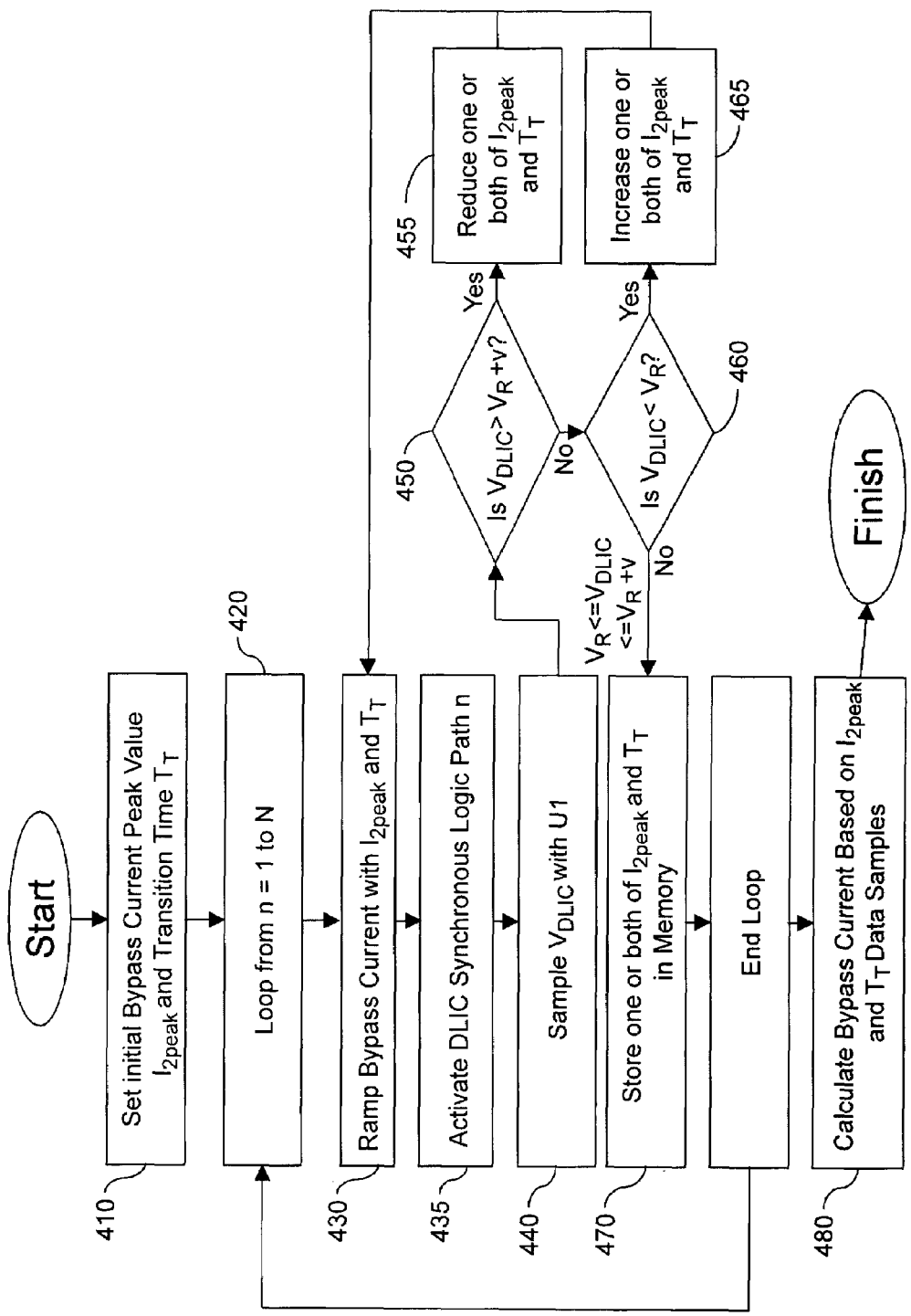
FIG. 4 is a flow chart illustrating a method of one embodiment of the present invention.

FIG. 4 is a flow chart illustrating another method of one embodiment of the present invention for determining a bypass current setpoint. In one embodiment, the bypass current setpoint specifies one or more characteristics of bypass current $i_2$ including one or more of the peak current for bypass current $i_2$, and the transition time for bringing bypass current $i_2$ to the peak current level. In one embodiment, during the test phase, digital logic integrated circuit 110 performs one or more switching operations while the test data output of voltage monitor 160 is stored in data table 168. In one embodiment, based on the test data output of voltage monitor 160 during the one or more switching operations, current controller 150 determines optimum bypass current $i_2$ characteristics that will produce a $V_{DLIC}$ at or above $V_R$, for all of the one or more switching operations and establishes the bypass current setpoint based on those bypass current $i_2$ characteristics. Note that reducing the bypass current $i_2$ peak and duration is very beneficial, because the bypass current $i_2$ peak and duration contribute to the overall power consumption of system 100.

The method begins at 410 with setting an initial bypass current peak value setting, $I_{2peak}$, and transition time, $T_T$. In one embodiment, $I_{2peak}$ is the peak value of bypass current $i_2$ (as illustrated generally by FIG. 2F at 271) while transition time, $T_T$ is the time in which bypass current $i_2$ transitions from a steady state value to $I_{2peak}$, (i.e., $T_T=t_2-t_1$). The method then comprises a loop sequence beginning at 420 which cycles in one step increments from one to N, where N is defined as the total number of synchronous logic paths to be executed.

Within the loop, micro-code instructions are executed to toggle a large number of gates along N synchronous logic paths within digital logic integrated circuit 110 causing large transients in the current demand $i_3$ of digital logic integrated circuit 110. The method provides for digital logic integrated circuit 110 to execute a plurality of such micro-code instructions, while observing $V_{DLIC}$, and collects test data that enables current management system 105 to determine a bypass current setpoint.

The method proceeds to 430 with ramping the bypass current $I_2$ based on $I_{2peak}$, and transition time, $T_T$. Then at 435, the method proceeds with immediately activating an n'th synchronous logic path within digital logic integrated circuit 110, where n is equal to the current loop cycle. For example, during a first loop cycle, the method activates a first synchronous logic path. In one embodiment, activating the n'th synchronous logic path further comprises executing one or more micro-code instructions within digital logic integrated circuit 110. The method then continues to 440 with sampling $V_{DLIC}$. In one embodiment, sampling $V_{DLIC}$ comprises capturing $V_{DLIC}$ data with a digital to analog converter that outputs a digital signal representative of $V_{DLIC}$. In one embodiment, current management system 105 only captures data samples that correlate in time with the execution of a synchronous logic path by digital logic integrated circuit 110. In one embodiment, current management system 105 correlates capturing $V_{DLIC}$ data samples with the execution of a synchronous logic path based on a priori information supplied by digital logic integrated circuit 110 as discussed in the '949 and '085 Applications herein incorporated by reference. In one embodiment, the method further comprises comparing $V_{DLIC}$ against reference voltage $V_R$ and when $V_{DLIC}$ is greater than an upper voltage limit equal to $V_R$ plus an acceptable variance, v, (450) the method continues to 455 and reduces one or both of current peak value setting, $I_{2peak}$, and transition time, $T_T$ and then returns to 430 to again activate the n'th synchronous logic path. In one embodiment, reference voltage $V_R$ is equal to $V_{min\ required}$. The variance v is readily determined by one of ordinary skill in the art upon reading this specification based on the efficiencies and tolerance desired for the specific application. When $V_{DLIC}$ is less than a lower voltage limit equal to $V_R$ (460) the method continues to 465 and increases one or both of current peak value setting, $I_{2peak}$, and transition time, $T_T$ and then returns to 430 to again activate the n'th synchronous logic path. Because $V_{min\ required}$ is defined as digital logic integrated circuit 110's minimum guaranteed operating voltage, the bypass current $I_2$ should not allow $V_{DLIC}$ to drop below $V_{min\ required}$. The degree to which to alter one or both of current peak value setting, $I_{2peak}$, and transition time, $T_T$ at 455 and 465 is readily determined by one of ordinary skill in the art upon reading this specification, based on factors such as response characteristics of the power supply powering the digital logic integrated circuit, the parasitic inductance, L, and the specific application of the system. When $V_{DLIC}$ is approximately equal to $V_R$ (i.e., within the acceptable variance v of $V_R$) one or both of $I_{2peak}$, and transition time, $T_T$ for synchronous logic path n are stored in memory (470). The method then returns to 420, and continues to loop while sampling $V_{DLIC}$ for each of the N synchronous logic paths and storing the test data into memory. In one embodiment, when the loop is complete, the method continues to 480 and calculates, based on the test data memory, a bypass current setpoint comprising one or both of a peak bypass current $i_2$ and a transition time, $T_T$ that will maintain $V_{DLIC}$ at or above $V_R$ for any of the N synchronous logic paths executed by digital logic integrated circuit 110 during the calibration. In one embodiment, calculating a bypass current setpoint further comprises determining one or both of the smallest peak bypass current $i_2$ and the shortest transition time, $T_T$ that will result in a $V_{DLIC}$ at or above $V_R$ for any of the N synchronous logic paths executed by digital logic integrated circuit 110. In one embodiment, based on the sampled values of $V_{DLIC}$, the method further calculates the value of expected switching value $I_{switch}$ (illustrated generally at FIG. 2G at 284) for ramping bypass current $i_2$ from $I_{switch}$, after completion of a digital logic operation, as described in the '085 Applications herein incorporated by reference.

In one embodiment, after calibration is complete, current management system 105 shifts from the test phase to the normal operation phase. In the normal operation phase, current controller 150 ramps bypass current $i_2$, in response to a priori information about the impending current needs of digital logic integrated circuit 110, as described above and in the '949 and '085 Applications herein incorporated by reference.

Figure 5:
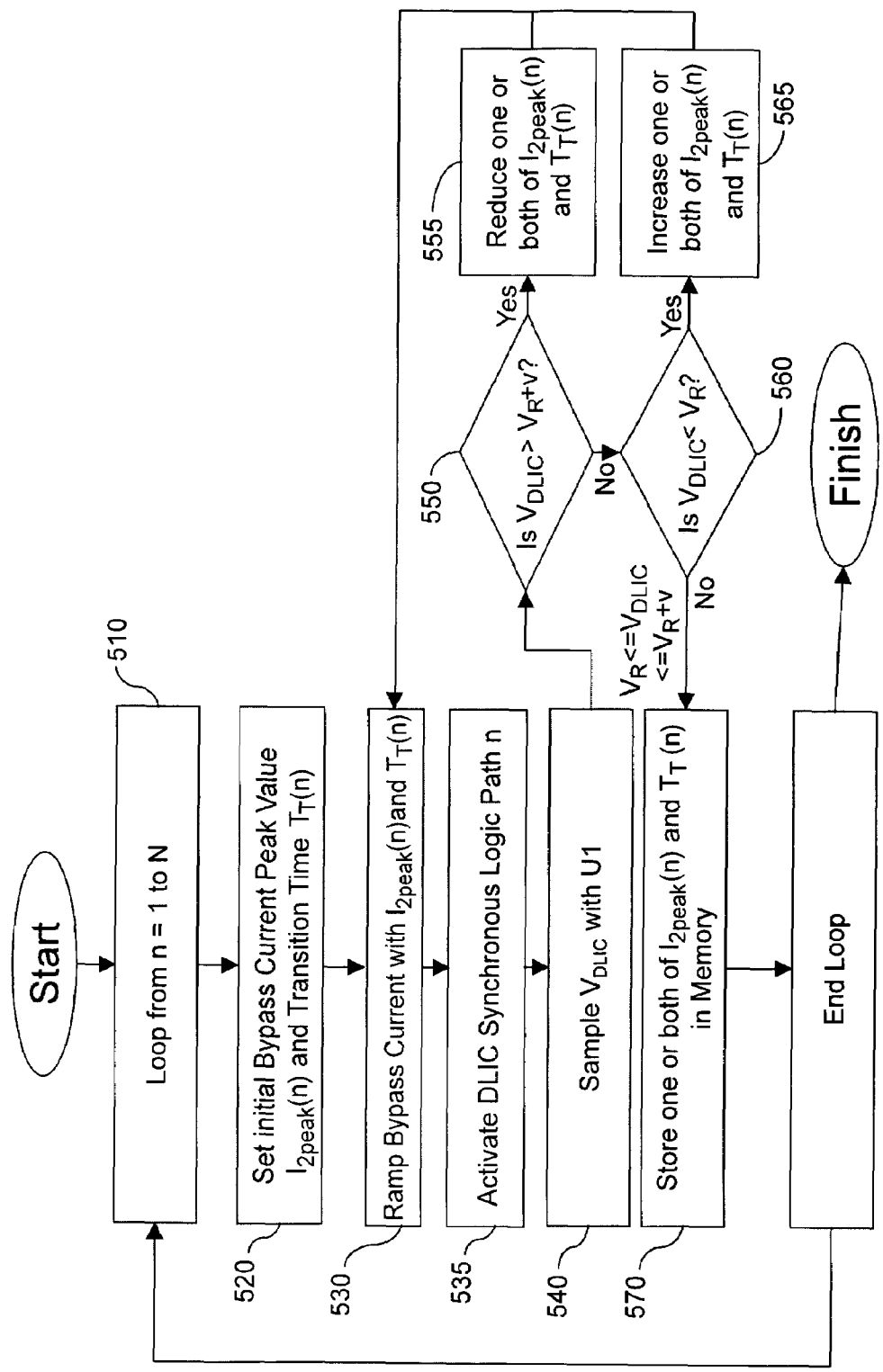
FIG. 5 is a flow chart illustrating a method of one embodiment of the present invention.

In some applications, the degree of voltage drop in $V_{DLIC}$ varies considerably, increasing with the complexity of the synchronous logic path required for the digital logic integrated circuit to execute one or more logic functions. In such cases, no one bypass current setpoint may prove adequate for maintaining $V_{DLIC}$ greater than or equal to $V_R$, while reducing fluctuations in $V_{DLIC}$ due to parasitic inductances. To address these applications, FIG. 5 is a flow chart illustrating a method of one embodiment of the present invention for determining an associated bypass current setpoint for each of the N synchronous logic paths which will ensure that current management system 105 will maintain $V_{DLIC}$ at or above $V_R$ while reducing transient parasitic voltages $V_L$. The method provided by FIG. 5 coordinates calibration of current management system 105 and generates test data for use by current management system 105 in determining a bypass current setpoint for each of N synchronous logic paths.

The method comprises a loop sequence beginning at 510 which cycles in one step increments from one to N, where N is defined as the total number of synchronous logic paths which will be executed. Within the loop, micro-code instructions are executed to toggle a large number of gates along N synchronous logic paths within digital logic integrated circuit 110, causing large transients in the current demand $i_3$ of digital logic integrated circuit 110. The method provides for digital logic integrated circuit 110 to execute a plurality of such micro-code instructions, while observing $V_{DLIC}$, and collects test data that enables current management system 105 to determine a bypass current setpoint for each of the N synchronous logic paths. In one embodiment, each synchronous logic path is associated with a logic function or operation performed by digital logic integrated circuit 110.

Within the loop, the method proceeds to 520, and sets an initial bypass current peak value setting, $I_{2peak}(n)$, and transition time, $T_T(n)$, for the n'th synchronous logic path, where n is equal to the current loop cycle. For example, during a first loop cycle, the method set an initial bypass current peak value setting $I_{2peak}(1)$ and transition time $T_T(1)$ for a first synchronous logic path. In one embodiment, $I_{2peak}$ is the peak value of bypass current $i_2$ (as illustrated generally by FIG. 2F at 271) while transition time, $T_T$ is the time in which bypass current $i_2$ transitions from a steady state value to $I_{2peak}$ (i.e., $T_T=t_2-t_1$).

The method proceeds to 530 with ramping the bypass current $I_2$ based on $I_{2peak}$, and transition time, $T_T$. Then at 535, the method proceeds with immediately activating an n'th synchronous logic path within digital logic integrated circuit 110, where n is equal to the current loop cycle. For example, during a first loop cycle, the method activates a first synchronous logic path. In one embodiment, activating the n'th synchronous logic path further comprises executing one or more micro-code instructions within digital logic integrated circuit 110. The method then continues to 540 with sampling $V_{DLIC}$. In one embodiment, sampling $V_{DLIC}$ comprises capturing $V_{DLIC}$ data with a digital to analog converter that outputs a digital signal representative of $V_{DLIC}$. In one embodiment, current management system 105 only captures data samples that correlate in time with the execution of a synchronous logic path by digital logic integrated circuit 110. In one embodiment, current management system 105 correlates capturing $V_{DLIC}$ data samples with the execution of a synchronous logic path based on a priori information supplied by digital logic integrated circuit 110 as discussed in the '949 and '085 Applications herein incorporated by reference. In one embodiment, the method further comprises comparing $V_{DLIC}$ against reference voltage $V_R$ and when $V_{DLIC}$ is greater than an upper limit equal to $V_R$ plus an acceptable variance, v, (550) the method continues to 555 and reduces one or both of current peak value setting, $I_{2peak}(n)$, and transition time, $T_T(n)$ and then returns to 530 to again activate the n'th synchronous logic path. In one embodiment, reference voltage $V_R$ is equal to $V_{min\ required}$. The variance v is readily determined by one skilled in the art upon reading this specification based on the efficiencies and tolerance desired for the specific application. When $V_{DLIC}$ is less than a lower limit equal to $V_R$ (560) the method continues to 565 and increases one or both of current peak value setting, $I_{2peak}(n)$, and transition time, $T_T(n)$ and then returns to 530 to again activate the n'th synchronous logic path. Because $V_{min\ required}$ is defined as digital logic integrated circuit 110's minimum guaranteed operating voltage, the bypass current $I_2$ should not allow $V_{DLIC}$ to drop below $V_{min\ required}$. The degree to which to alter one or both of current peak value setting, $I_{2peak}(n)$, and transition time, $T_T(n)$ at 555 and 565 is readily determined by one of ordinary skill in the art upon reading this specification, based on factors such as response characteristics of the power supply powering the digital logic integrated circuit, the parasitic inductance L, and the specific application of the system. When $V_{DLIC}$ is approximately equal to $V_R$ (i.e., within the acceptable variance v) one or both of $I_{2peak}(n)$, and transition time, $T_T(n)$ for synchronous logic path n are stored in memory (570). The method then returns to 510, sampling $V_{DLIC}$ for each of the N synchronous logic paths and storing the test data into memory. In this way, the current controller essentially learns through trial and error where to limit the bypass current for each of the logic functions. In one embodiment, based on the sampled values of $V_{DLIC}$, the method further calculates the value of expected switching value $I_{switch}$ (illustrated generally at FIG. 2G at 284) for ramping bypass current $i_2$ from $I_{switch}$, after completion of a digital logic operation, as described in the '085 Applications herein incorporated by reference.

Thus, after calibration is complete, the memory 165 of current management system 105 holds test data that allows the current management system 105 to correlate a logic operation performed by digital logic integrated circuit 110 with one or both of an peak bypass current and a transition time for controlling the bypass current $I_2$. In one embodiment, in normal operation mode, in response to a priori information from digital logic integrated circuit 110, current controller 150 looks up one or both of a $I_{2peak}$, and a transition time, $T_T$ associated with a pending logic operation identified by the a priori information. Current controller 150 ramps bypass current $i_2$, as described above and in the '949 and '085 Applications herein incorporated by reference, in order to maintain $V_{DLIC}$ at or above $V_R$ while the reducing transient parasitic voltages $V_L$.

Several means are available to implement the methods discussed above. These means include, but are not limited to, digital computer systems, programmable controllers, or field programmable gate arrays. Therefore other embodiments of the present invention are program instructions resident on computer readable media which when implemented by such processors, enable the processors to implement embodiments of the present invention. Computer readable media include any form of computer memory, including but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method for calibrating a digital logic circuit current management system, the method comprising:
   activating one or more synchronous logic paths of a plurality of synchronous logic paths within the digital logic integrated circuit;
   sampling a voltage powering the digital logic integrated circuit while activating the one or more synchronous logic paths;
   storing one or more data samples representative of the sampled voltage; and
   calculating a bypass current setpoint based on the one or more data samples, wherein the bypass current setpoint specifies one or more bypass current characteristic to prevent the voltage powering the digital logic integrated circuit from dropping below a reference voltage.

2. The method of claim 1, wherein activating one or more synchronous logic paths further comprises executing one or more micro-code instructions on the digital logic integrated circuit.

3. The method of claim 1, wherein calculating a bypass current specifying one or more bypass current characteristic further comprises determining one or more of a peak current, and a transition time.

4. The method of claim 1, wherein sampling a voltage further comprise comparing the voltage powering the digital logic integrated circuit against a reference voltage.

5. The method of claim 1, wherein calculating a bypass current setpoint further comprises determining one or both of a peak bypass current and a transition time that will result in the voltage powering the digital logic integrated circuit at or above the reference voltage for any of the one or more synchronous logic paths activated within the digital logic integrated circuit.

6. The method of claim 1 further comprising:
   calculating an expected switching current value based on the voltage sampled while activating the one or more synchronous logic paths.

7. A method for calibrating a digital logic circuit current management system, the method comprising:
   setting one or both of a bypass current peak value and a transition time;
   ramping a bypass current based on one or both of the initial bypass current peak value and the transition time;
   activating a first synchronous logic path of a plurality of synchronous logic paths within the digital logic integrated circuit;
   sampling a voltage powering the digital logic integrated circuit while activating the first synchronous logic path;
   when the sampled voltage is greater than an upper voltage limit, reducing one or both of the bypass current peak value and the transition time;
   when the sampled voltage is less than a lower voltage limit, increasing one or both of the bypass current peak value and the transition time;
   when the sampled voltage is within the upper voltage limit and the lower voltage limit, storing one or both of the bypass current peak value and the transition time as a test data sample in a memory; and
   calculating a bypass current setpoint based on one or more test data samples stored in the memory.

8. The method of claim 7, wherein calculating a bypass current further comprises determining one or more of a peak current, and a transition time.

9. The method of claim 7, wherein the upper voltage limit is greater than or equal to a digital logic integrated circuit minimum guaranteed operating voltage plus a variance.

10. The method of claim 7, wherein the lower voltage limit is less than or equal to a digital logic integrated circuit minimum guaranteed operating voltage.

11. The method of claim 7, wherein calculating a bypass current setpoint further comprises calculating one or both of a peak bypass current and a transition time that will maintain the voltage powering the digital logic integrated circuit greater than or equal to a minimum guaranteed operating voltage of the digital logic integrated circuit.

12. The method of claim 7, wherein sampling a voltage further comprise comparing the voltage powering the digital logic integrated circuit against a reference voltage.

13. The method of claim 7, wherein activating one or more synchronous logic paths further comprises executing one or more micro-code instructions on the digital logic integrated circuit.

14. The method of claim 7, wherein calculating a bypass current setpoint further comprises determining one or both of a peak bypass current and a transition time that will result in the voltage powering the digital logic integrated circuit at or above the reference voltage for any of the plurality of synchronous logic paths activated within the digital logic integrated circuit.

15. The method of claim 7 further comprising:
    calculating an expected switching current value based on the voltage sampled activating the first synchronous logic path.

16. A method for calibrating a digital logic circuit current management system, the method comprising:
    setting one or both of an initial bypass current peak value and an transition time;
    ramping a bypass current based on one or both of the initial bypass current peak value and the transition time;
    activating a first synchronous logic path of a plurality of synchronous logic paths within the digital logic integrated circuit;
    sampling a voltage powering the digital logic integrated circuit while activating the first synchronous logic path;
    when the sampled voltage is greater than an upper voltage limit, reducing one or both of the initial bypass current peak value and the transition time;
    when the sampled voltage is less than a lower voltage limit, increasing one or both of the initial bypass current peak value and the transition time; and
    when the sampled voltage is within the upper voltage limit and the lower voltage limit, storing one or both of the initial bypass current peak value and the transition time in a memory as a first bypass current setpoint, wherein the memory is adapted to associate the first bypass current setpoint with the first synchronous logic path.

17. The method of claim 16, wherein activating one or more synchronous logic paths further comprises executing one or more micro-code instructions on the digital logic integrated circuit.

18. The method of claim 16, wherein sampling a voltage further comprise comparing the voltage powering the digital logic integrated circuit against a reference voltage.

19. The method of claim 16, wherein the upper voltage limit is greater than or equal to a digital logic integrated circuit minimum guaranteed operating voltage plus a variance.

20. The method of claim 16, wherein the lower voltage limit is less than or equal to a digital logic integrated circuit minimum guaranteed operating voltage.

21. The method of claim 16 further comprising:
calculating an expected switching current value based on the voltage sampled activating the first synchronous logic path.

22. A current management system for a digital logic integrated circuit, the system comprising:
means for controlling a bypass current, the means for controlling adapted to control the bypass current based on a priori information about an impending current need of a digital logic integrated circuit;
means for drawing the bypass current from the means for supplying current, the means for drawing the bypass current connected electrically in parallel with a digital logic integrated circuit and responsive to the means for controlling;
means for activating one or more synchronous logic paths of a plurality of synchronous logic paths within the digital logic integrated circuit;
means for sampling a voltage powering the digital logic integrated circuit while activating the one or more synchronous logic paths, the means for sampling responsive to the means for activating;
means for storing one or more data samples representative of the sampled voltage, the means for storing responsive to the means for sampling; and
means for calculating one or more bypass current setpoints based on the one or more data samples, wherein the one or more bypass current setpoints specify one or more bypass current characteristic.

23. The system of claim 22, wherein the means for calculating one or more bypass current setpoints specifying one or more bypass current characteristic further determines one or more of a peak current, and a transition time.

24. The system of claim 22, further comprising:
wherein the means for storing one or more data samples is adapted to correlate a first logic operation of one or more logic operations performed by the digital logic integrated circuit with a first bypass current setpoint of the one or more bypass current setpoint, the means for correlating responsive to the digital logic integrated circuit, and the means for controlling responsive to the means for storing.

25. The system of claim 22, further comprising:
means for comparing the voltage powering the digital logic integrated circuit with a reference voltage, the means for calculating responsive to the means for comparing.

26. A computer-readable medium having computer-executable instructions for calibrating a digital logic circuit current management system, the method comprising:
activating one or more synchronous logic paths of a plurality of synchronous logic paths within the digital logic integrated circuit;
sampling a voltage powering the digital logic integrated circuit while activating the one or more synchronous logic paths;
storing one or more data samples representative of the sampled voltage; and
calculating one or more bypass current setpoints based on the one or more data samples, wherein the one or more bypass current setpoints are calculated to limit a peak current of a bypass current to prevent a voltage powering a digital logic integrated circuit from dropping below a reference voltage.

27. The computer-readable medium of claim 26, wherein calculating one or more bypass current setpoints further comprises calculating one or both of one or more peak bypass currents and one or more bypass current transition times that will maintain the voltage powering the digital logic integrated circuit greater than or equal to a minimum guaranteed operating voltage of the digital logic integrated circuit.

* * * * *